United States Patent [19]
Tavernetti

[11] Patent Number: 5,773,971
[45] Date of Patent: Jun. 30, 1998

[54] THREE ELECTRODE AC DETECTION

[75] Inventor: Russell E. Tavernetti, San Carlos, Calif.

[73] Assignee: Zircon Corporation, Campbell, Calif.

[21] Appl. No.: 689,427

[22] Filed: Aug. 8, 1996

[51] Int. Cl.[6] .......................... G01R 19/145; G01V 3/08; G01V 3/165
[52] U.S. Cl. .............................. 324/67; 324/72; 324/133; 324/326
[58] Field of Search .................................... 324/326, 348, 324/357, 358, 365, 67, 72, 133, 452, 456, 457, 530, 672, 679, 705

[56] References Cited

U.S. PATENT DOCUMENTS

| | | | |
|---|---|---|---|
| 2,531,088 | 11/1950 | Thompson | 324/365 |
| 4,099,117 | 7/1978 | Erath | 324/357 X |
| 4,220,913 | 9/1980 | Howell et al. | 324/326 X |
| 4,520,317 | 5/1985 | Peterman | 324/326 |
| 4,752,727 | 6/1988 | Schneider | 324/672 X |
| 5,043,666 | 8/1991 | Tavernetti et al. | 324/326 |
| 5,184,083 | 2/1993 | Groover | 324/357 X |
| 5,444,364 | 8/1995 | Satterwhite et al. | 324/67 |
| 5,617,031 | 4/1997 | Tuttle | 324/326 |

FOREIGN PATENT DOCUMENTS 71682  4/1988  Japan ..................... 324/326

*Primary Examiner*—Gerard R. Strecker
*Attorney, Agent, or Firm*—Skjerven, Morrill, MacPherson, Franklin & Friel LLP; Norman R. Klivans

[57] ABSTRACT

A sensor device and method for finding the location of a conductor such as a wire, having an alternating voltage and which is not readily visible, i.e. hidden in the wall of a structure or buried. The detector device has four plates in two balanced pairs and arranged in a quadrilateral with a central reference plate. This reference plate provides a common mode rejection of the background electric field typically present for instance on the wall, which is induced by the alternating voltage in the wire. A sharp signal peak is detectable immediately over the wire from a differential signal of a pair of the balanced plates, when the plates of the pair are located on either side of the wire. Also a determination based on the sum and difference of the signals from the two plates allows one to determine the relative phase induced in the two plates of each pair, which indicates the direction in which the sensor device should be moved in order for the plates to be immediately over the target wire.

9 Claims, 7 Drawing Sheets

THREE ELECTRODE AC DETECTION

BACKGROUND OF THE INVENTION

1. Field of the Invention

This invention generally relates to electronic detection devices and more particularly to a device and method for locating a conductor having an alternating voltage, for instance a wire present inside a wall of a structure or buried in the ground.

2. Description of the Prior Art

There are a large number of techniques and devices for determining the location of an electric voltage-carrying conductor, in the context of the conductor being located in a wall or floor of a structure or in the ground or under water. Many of these techniques use an inductive sensor such as a coil; others use electrostatic sensors. U.S. Pat. No. 5,444,364 discloses a differential sensor with two opposing electrodes to provide greater resolution for conductor isolation. The electric field generated by the voltage in the target conductor generates a signal (voltage) in the electrodes. The differential electric field potential sensor measures a difference in potential of two equi-potential surfaces. Since the two sensing electrodes both lie in one equi-potential plane, the detected difference will normally be zero if they are both the same distance from the conductor. The detected difference is a maximum where the sensor is aligned such that a line from one sensing electrode to the other is perpendicular to an intersecting equi-potential surface. This improves the spatial resolution of the device.

However, such prior art devices can suffer from the shortcoming that they fail to recognize the need to cancel out the effects of electric charges which are present for instance on a wall of a structure behind which the electrical wire is present. That is, the present inventor has recognized that in a typical situation the alternating voltage in e.g. a wire in the wall of the structure induces alternating electric charges on the interior and exterior surfaces of the wall. A standard voltage detector device normally has a non-balanced sensor plate arrangement (the sensor plates are not identical). This non-balanced arrangement has been found by the present inventor to be unable to reject the large common mode signal induced in both plates due to the charges present on the wall. Hence the target wire is masked by the induced charges. The induced charges are spread out over a relatively large surface area of the wall and hence make it difficult to accurately detect the exact position of the wire in (behind) the wall. The effect of this is that the signal being detected is spread over a large area instead of a well defined localized signal from the alternating voltage in the wire.

SUMMARY

Having defined the problem of what degrades the detection signal, i.e. the electric charges induced on the wall by the AC voltage in the wire to be detected, the present inventor has solved this wall charge problem by providing two spaced apart and balanced (identical in length, width and thickness) electrode sensor plates. Each sensor plate is referenced electrically to a third reference plate. These balanced sensor plates are then used to make a true differential measurement of the electric field caused by the alternating voltage in the wire.

Since the two sensor plates and the third reference plate are all fairly closely spaced together, the induced charge pattern on or in the wall appears to the three plates to be a uniform strength electric field, which induces an equal voltage in each of the two sensor plates. Thus both sensor plates will provide essentially a common mode signal, which is similar to that present on the reference plate. Since the differential component of the common mode signal is zero, the wall charge induced signal is rejected.

In one embodiment therefore the signal at each of the sensor plates has subtracted from it the signal at the reference plate, and then a difference is taken of the resulting two sensor plate signals to produce a differential signal. When the two sensor plates are immediately over the wire, this produces a clearly defined indication of the location of the wire. In another embodiment this differential signal is then combined with a sum of the signals from the two sensor plates and a scaling factor to better differentiate when the plates are close to the wire or very far away from the wire. This provides an even more readily distinguishable signal peak which is centered over the wire.

In another embodiment, instead of two plates, four plates are arranged in a quadrilateral, i.e. a left-right pair of sensor plates and a top-bottom pair of sensor plates, each sensor plate being referenced to the reference plate. This allows determination of the location of a wire in two dimensions. This is accomplished in one embodiment by determining if there is any phase difference between the difference signal of each pair of plates and the sum signal from the same pair. If there is such a phase difference, this is used to provide an indication of the direction in which the device (i.e., at least that part of the device including the plates) should be moved to be directly over the voltage-carrying wire. This indication is then combined with the signal strength indication to show when the device is directly over the wire.

DETAILED DESCRIPTION

As described above, the present inventor has determined that the actual electric field near a conductor carrying an alternating voltage and located in or behind a wall or other surface (e.g. in the ground) consists of the secondary charges induced on the wall (or in the ground), typically on both inner and outer wall surfaces, combined with the primary field from the alternating voltage in the conductor (wire). Since the secondary charges on the wall surfaces are closer to the sensor plates (electrodes) of the detector apparatus than is the wire, the secondary charges have been found to induce a much larger signal onto the sensor plates than does the alternating voltage in the wire. Thus in accordance with the invention this larger common mode signal from the secondary charges is eliminated, so that the smaller electric field due to the voltage on the conductor can be detected as a voltage level induced on the sensor plates.

Figure 1:
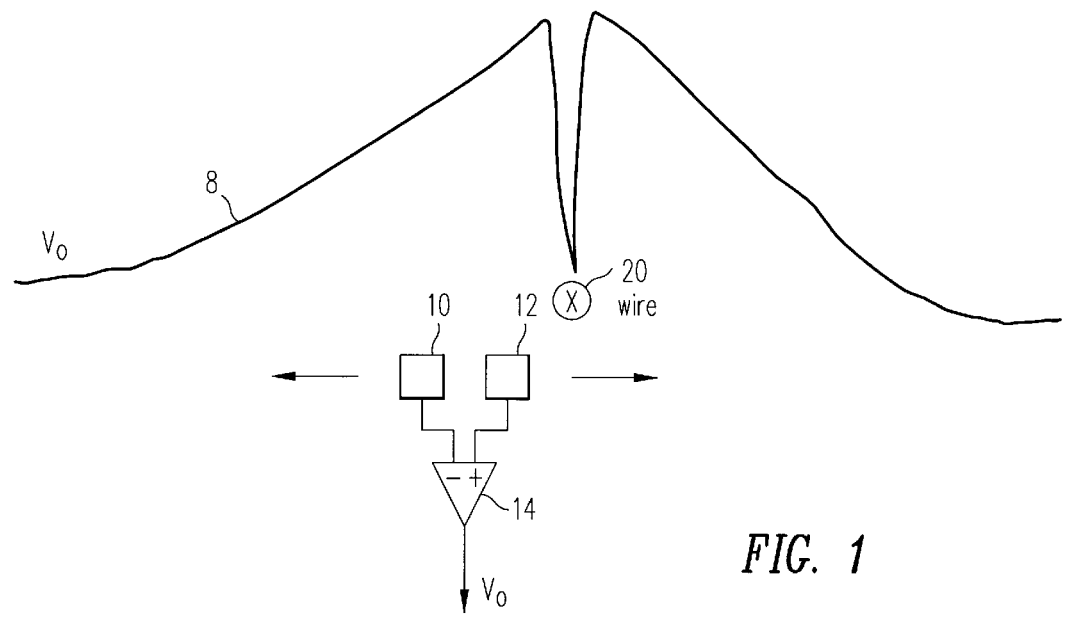
FIG. 1 shows graphically a differential signal measurement in accordance with this invention.

FIG. 1 shows diagrammatically a differential signal measurement in accordance with this invention. The plot 8 is of a signal (voltage), with the voltage amplitude being along the vertical axis and designated $V_0$. As shown in the lower portion of FIG. 1, in this case a sensor device, shown diagrammatically, includes two sensor plates (electrodes), a left plate 10 and a right plate 12. The left plate 10 is connected to the negative input terminal of a differential amplifier 14 and the right plate 12 is connected to the positive input terminal. The output signal from the comparator 14 is $V_0$ and is the signal 8 plotted in the upper portion of FIG. 1. The target wire 20 is shown diagrammatically in cross-section and is of course typically actually two conductors. With this differential measurement, the electric field generated by the voltage in wire 20 is measured as a difference between the resulting signals on the left plate 10 and the right plate 12, where L designates left and R designates right (these designations are of course arbitrary).

Movement of the sensor device is shown by the arrows adjacent plates 10 and 12, and results in the corresponding signal 8 with a sharp negative peak as shown when the plates 10, 12 are directly over the wire 20. It is to be understood that typically a wall is present between the wire 20 and the sensor plates 10 and 12, but of course this is not required. In other cases the wire is buried in the ground or is otherwise not visible, e.g. under water.

At a distance from the wire 20, the potential difference between plates 10 and 12 is low, as shown in the leftmost and rightmost portions of signals, and therefore the voltage $V_0$ output from the differential amplifier 14 is also low. As the sensor device is moved closer to the wire 20, the potential gradient between plates 10 and 12 increases up to the point where the plates 10 and 12 are centered over the wire 20. At this point, the field strength experienced by both plates 10, 12 is equal and the differential becomes zero as shown by the sharp negative peak in the signal 8. Thus FIG. 1 shows a differential signal 8 which may be written algebraically as L−R.

Figure 2:
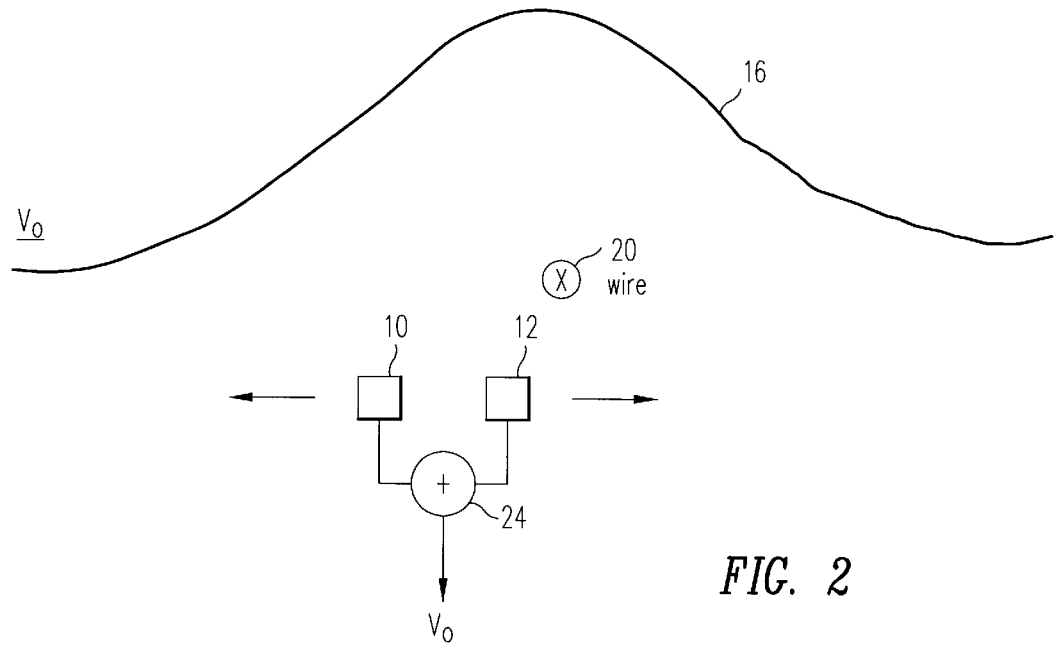
FIG. 2 shows a sum of two signals measurement also used in accordance with this invention.

Another way to locate wire 20 is to observe the sum of signals L+R, as shown in FIG. 2. In this case the left plate 10 and the right plate 12 are each connected to an adder 24 i.e., a summing node, outputting the summing voltage also designated here as $V_0$. In this case when the sensor device including plates 10 and 12 is moved left and right as shown by the arrows, the output voltage $V_0$ is a signal 16 having relatively wide, shallow (rounded) peak. This is the conventional prior art type of measurement resulting in the wide shallow peaked signal 16. Clearly it is difficult to determine the actual top of the peak of signal 16 and hence this gives an imprecise measurement taken by itself.

Hence in one embodiment of the invention the location of the wire 20 is determined by a differential circuit of the type shown in the lower portion of FIG. 1. It has been found by the present inventor that in some cases it is advantageous to combine the detection method of FIG. 2 with that of FIG. 1. In this case, the output signal is the output signal L+R of FIG. 2 combined with the L−R output signal of FIG. 1 and a scale factor K in order to provide an output signal which is algebraically (L+R)/K (L−R). This output signal 22 is shown graphically in FIG. 3 as a single sharp peak with a value of zero away from the peak. This has the advantage over the approach of FIG. 1 that the only zero signal levels are those detected well away from the wire 20, whereas in the arrangement of FIG. 1 under some circumstances it might be possible to confuse the zero of the negative peak detected near the wire 20 with the zero levels detected well away from the wire 20. Hence the positive peak of the signal 22 of FIG. 3 is an easily distinguishable single peak only over the wire 20.

Figure 3:
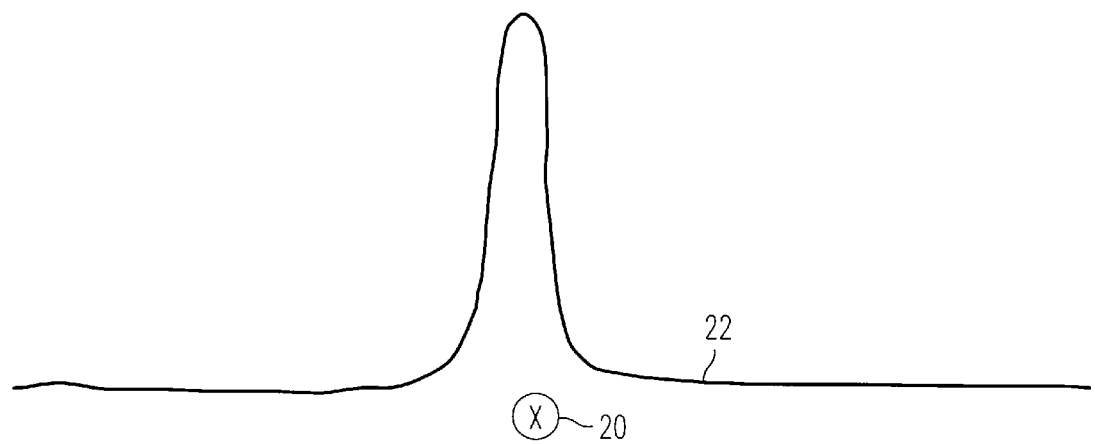
FIG. 3 shows a peak signal resulting from the combination of the measurements of FIGS. 1 and 2.

In addition to providing the single sharp peaked signal 22 of FIG. 3 giving a unique indication of being located at over the wire, this information is used as positional information contained in the relative phases of the L−R and L+R signals. It is to be understood that since the relevant electric field is alternating, it has a phase, i.e. a timing factor. In the United States, alternating current oscillates at 60 cycles per second and in some other countries 50 cycles per second. This provides a characteristic phase which is seen in the sinusoidally varying amplitude of the voltage. The present inventor has determined that by comparing the phases of the L−R signal to that of the L+R signal, it is possible to determine whether the wire is located to the left or right of (or above or below) the detector plates.

Figure 4:
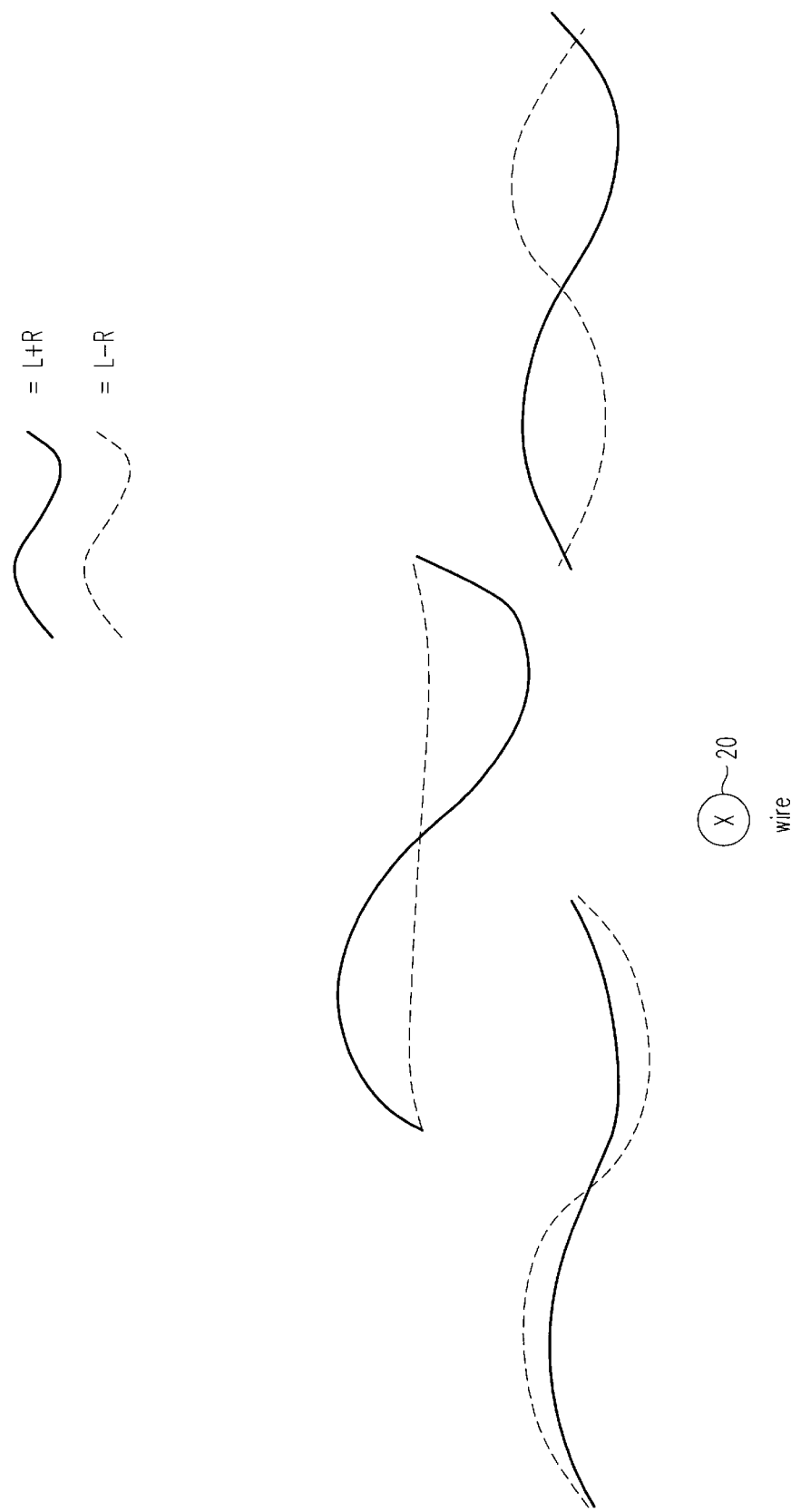
FIG. 4 shows several phase relationships for two sensor plates.

This is better understood with reference to FIG. 4. The upper right portion of FIG. 4 is only a key showing the solid line sinusoidal wave form is the L+R i.e. sum of the left sensor plate voltage and right sensor plate voltage signal, and the dotted line sinusoidal waveform is the L−R signal, i.e. the difference between the left sensor plate voltage and right sensor plate voltage. For the wire 20 as shown in cross section in the lower portion of FIG. 4, measurements are taken of the value (amplitude) of both the L+R and L−R signals at three different positions, i.e. to the left of wire 20, immediately above wire 20, and to the right of wire 20. As can be seen when the detector device is immediately over wire 20, the L−R signal is essentially zero whereas the L+R signal exhibits the usual sine wave pattern. However, when the detector is to the left of wire 20, the L+R and L−R signals are nearly in phase.

For the situation where the detector device is to the right of wire 20, as shown in the right hand portion of FIG. 4, the L+R and L−R signals are 180° out of phase. Thus it is seen how the relative phase of the L−R signal changes relative to that of the L+R signal, depending on which side of the wire 20 the detector device is located. This of course is useful in locating the wire 20.

Figure 5:
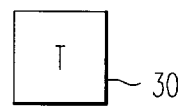
FIG. 5 shows an arrangement of four sensor plates and a reference plate in accordance with this invention.
Figure 5:
Figure 5:
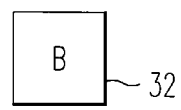

The above disclosure is directed to use of left and right sensor plates (electrodes). However, this also applies to a device having four plates as shown in FIG. 5. FIG. 5 shows schematically the plate arrangement for a sensor device in another embodiment, where in addition to the left (L) and right (R) plates respectively 10 and 12, there is a central reference (ref) plate 26, which is also the reference for the top (T) plate 30 and the bottom (B) plate 32. The top plate 30 and bottom plate 32 form a second plate pair which is employed in identical fashion to the left and right plate pair, except for being oriented at a 90° angle thereto. Thus here there are two plate pairs which are (1) left and right, and (2) top and bottom.

In one embodiment, as disclosed below, the only minor difference to the FIG. 5 arrangement is with regard to the plate balance point, where the voltage at the top plate minus that of the bottom plate is equal to zero. Thus the balance point may not be exactly centered physically between the top and bottom plates but is a little closer to the top plate, because in this embodiment the plates are laid out in non-symmetrical fashion as described further below. This is due to the particular mechanical design of one version of the sensor device housing. However, the actual physical arrangement shown in FIG. 5 is also possible in other embodiments, so that the left-right and top-bottom plate responses are identical.

Typically the sensor and reference plates themselves are actual solid metal structures or in other embodiments are areas of copper film formed on an insulated substrate, i.e. a PCB (printed circuit board) assembly.

The advantage of the two-axis configuration of FIG. 5 with four sensor plates is to measure the voltage differential in two dimensions. Then by combining the two values (L+R)/K1(L−R) and (T+B)/K2(T+B), where K1 and K2 are scaling constants, an indication is generated which can be used to guide the user to the actual target location. This is better understood with reference to FIG. 6.

Figure 6A:
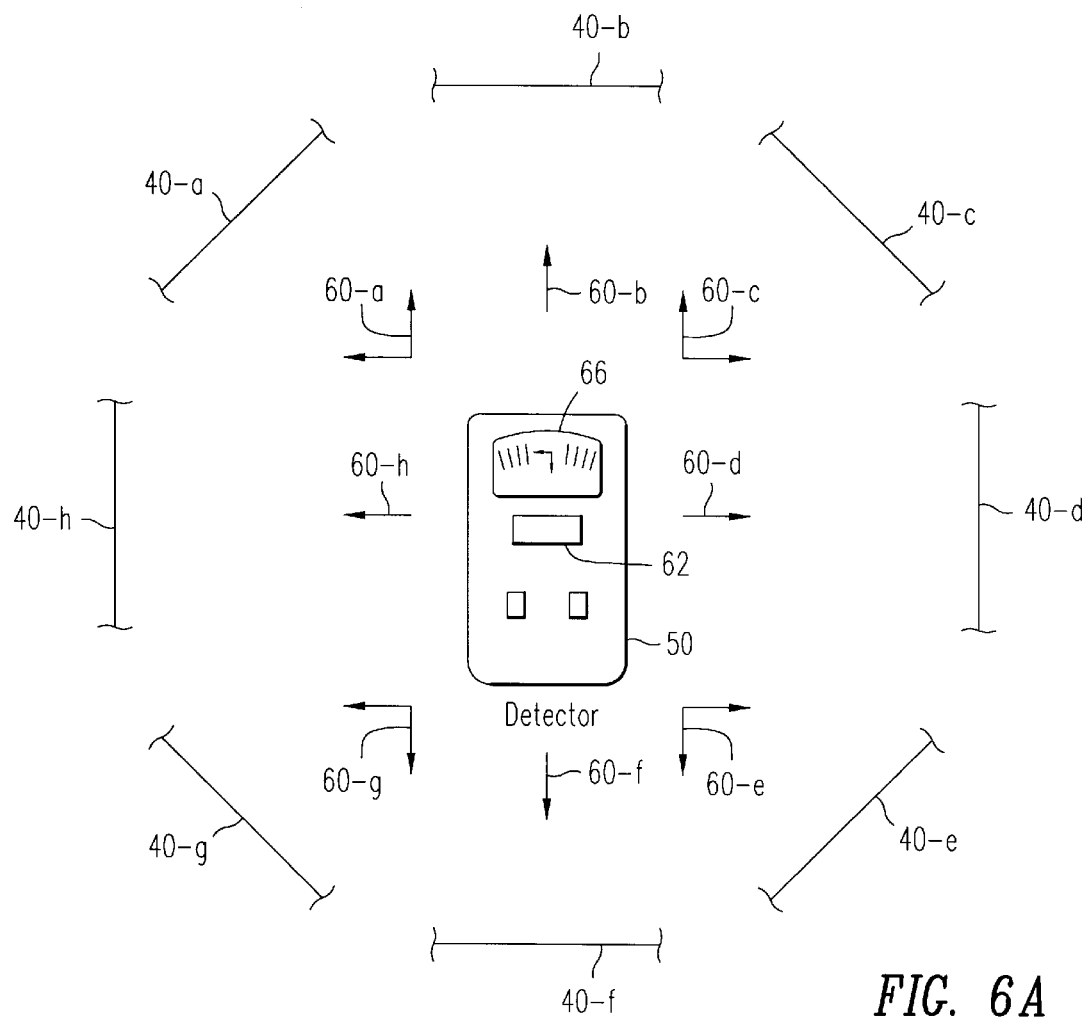
FIG. 6A shows a device in accordance with this invention and its resulting display, to show in what direction the device is moved to be over a voltage-carrying conductor.

FIG. 6A is diagrammatic and is intended to describe this two-dimensional guiding of the user to the actual wire location. It is to be appreciated that given the signal of for instance FIG. 3, it is often not clear whether one is to the left or right of the target wire. This is even more of a problem in two dimensions. The aspect of the present invention in accordance with FIG. 6A solves this problem and hence makes the present detector device more useful.

Hence FIG. 6A shows a wire 40-a, . . . , 40-h in various orientations with respect to the present detector device 50. The wire is shown truncated merely for purposes of illustration; each representation is intended to be a voltage carrying wire. In this hypothetical example the user (not shown) is holding a hand held version of the detector device 50 against a wall which corresponds to the plane of the drawing. By combining the signals as described by the above equations, it is possible to provide a directional display 62 on the detector 50 which shows in which direction the target wire 40-a etc. is oriented with respect to the detector. Not only is the wire orientation thereby shown, but also the direction in which the detector device 50 should be moved in order to be immediately over the wire is shown.

Here arbitrarily eight different wire orientations are shown, but this is not limiting. In this particular example for each of the eight orientations 40-a etc. of the wire, the detector device 50 processes the signals (as described further below) to provide an indication of the wire orientation and the direction in which detector device 50 must be moved to be closer to the wire, as shown by the small arrow indicators (icons) 60-a, . . . , 60h. Thus by processing the four input signals L, R, T, B generated respectively by the four sensor plates of FIG. 5, and as described in further detail below, the detector device 50 generates a display e.g. on an LCD 62 which illuminates at any one time one of the arrow icons 60-a, . . . , 60-h. Each arrow icon in effect points to which direction the wire lies relative to detector device 50, and also the approximate orientation of the wire. A useful two-dimensional display is thereby provided which guides the user of the detector device 50 to move the detector device 50 to the target wire and shows in which direction the detector device 50 should be oriented in order to obtain the best signal strength measurement.

Of course the icons 60-a, . . . , 60-h shown here are exemplary and not limiting. Other types of visual indicators, or even an audible indicator, may also be provided.

Figure 6B:
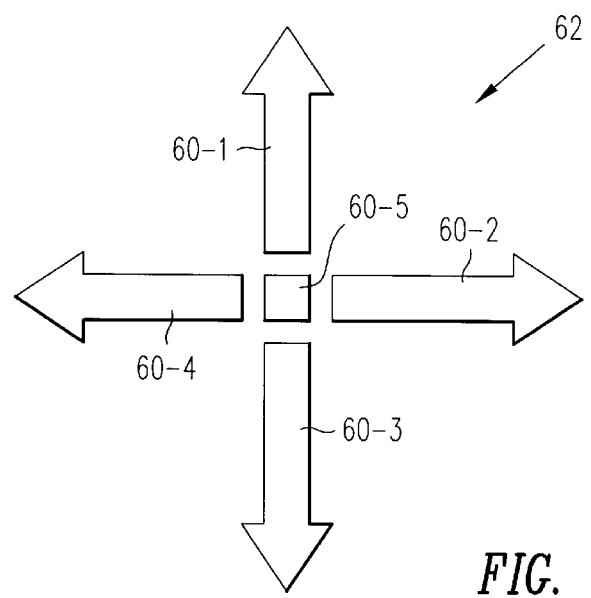
FIG. 6B shows one way to generate the display of FIG. 6A.

FIG. 6B shows the actual LCD segments used in one embodiment to generate the icons 60a, . . . , 60b of FIG. 6A. As shown, four arrow segments 60-1, 60-2, 60-3, 60-4, when illuminated in various combinations define the icons 60-a, . . . , 60-h. The central segment 60-5 is illuminated when one is over the wire in either the T/B or L/R directions.

At the same, time a second display 66 on detector unit 50 indicates signal strength. Various versions of this signal strength display 66 are possible. For instance in one version, when directly over the target wire, a segment of the display is illuminated. The signal strength indication alternatively is a metertype display which typically is a portion of LCD 66 showing the relative signal strength by illuminating LCD segments. Other versions and modifications to the display will be apparent to one skilled in the art.

Figure 7:
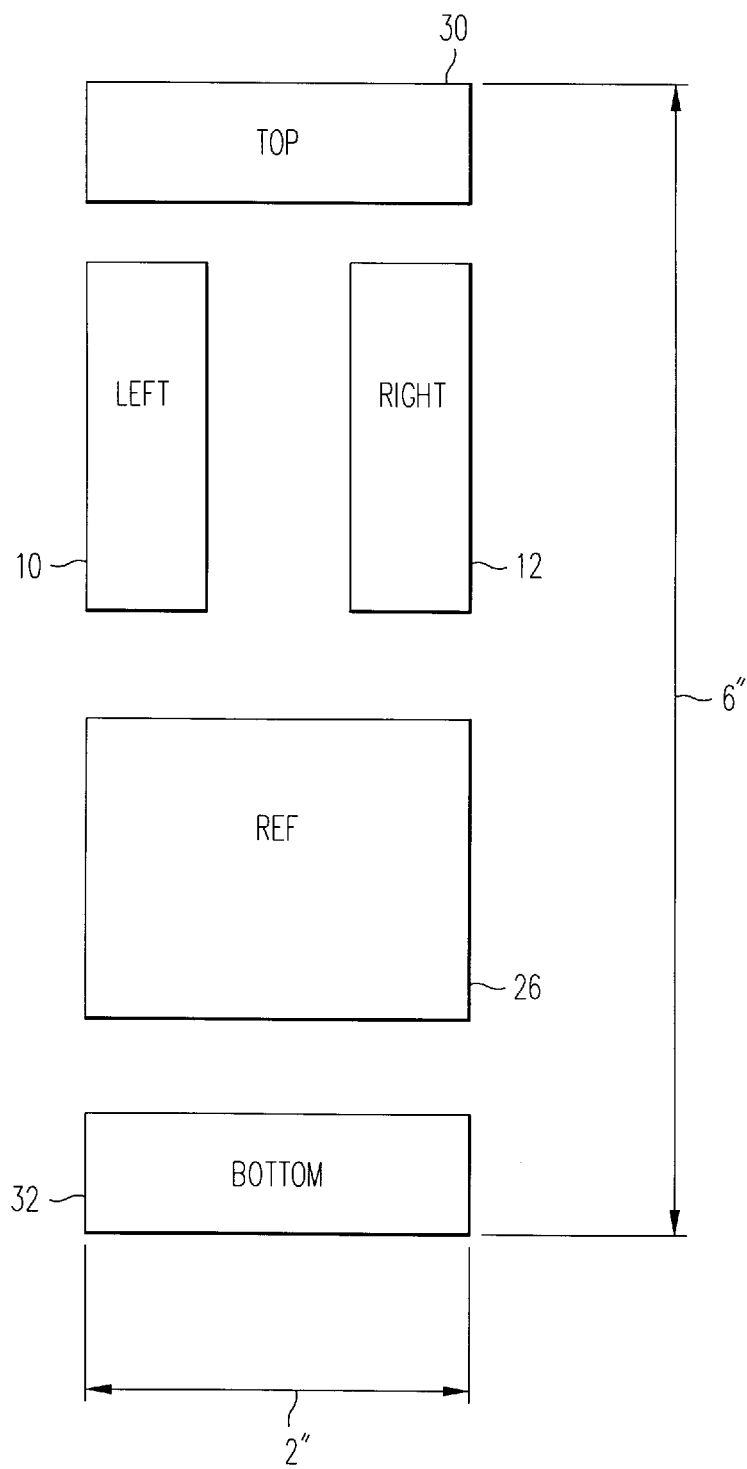
FIG. 7 shows an arrangement of sensor plates and a reference plate in accordance with this invention.

In one embodiment of the detector device the plate layout of FIG. 5 is as shown in FIG. 7. Here only the plates, i.e. the conductive electrode areas are shown, and not the electrical connections thereto which are described below. The plates in FIG. 7 have the same reference numbers as in FIG. 5. However here the non-symmetric plate arrangement is more convenient for a particularly housing of detector 50 and is not limiting. The dimensions shown are merely illustrative; the actual dimensions of the plates are not critical. Further the size and spacing of the plates could vary with the amount of voltage in the wire being detected and the distance at which it is desired to detect the voltage. The plates, shown to scale in FIG. 7, are to detect wires present in the wall of a dwelling or office building carrying 120 volt 60 cycle AC voltage. In order to detect e.g. underground buried electric cables, it is desirable to have far larger sized plates spaced considerably further apart. Such scaling modifications are of the type well understood by one of ordinary skill in the art.

Figure 8:
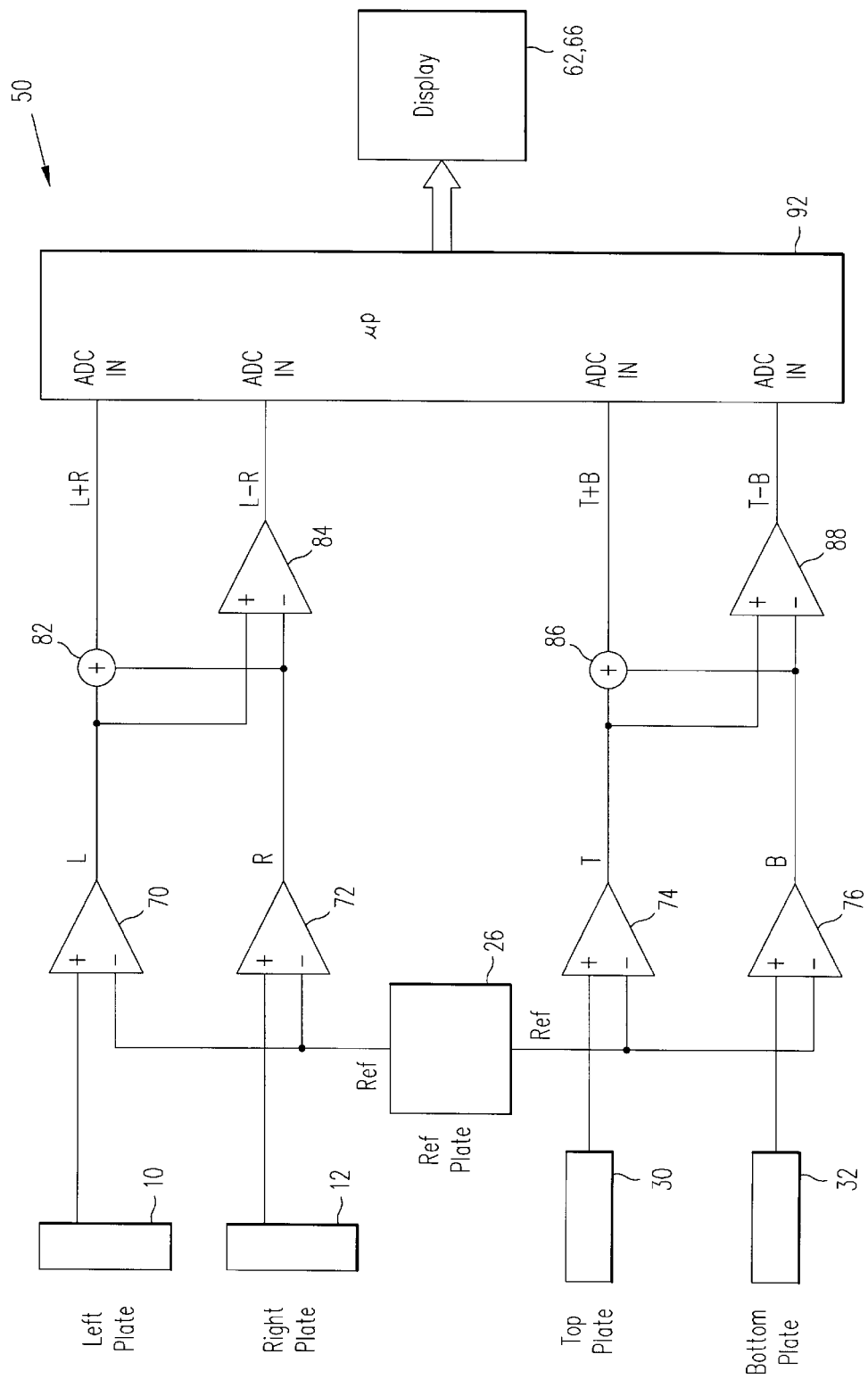
FIG. 8 shows a block diagram of a circuit in accordance with this invention.

FIG. 8 shows in a block diagram circuitry for a detector device 50 in accordance with this invention. It is to be understood that this is representative of one embodiment of such a detector device and is not limiting. Furthermore the embodiment shown in FIG. 8 partially uses analog circuitry and partially uses the functionality of microprocessor 92; in other embodiments the partitioning between circuitry and the microprocessor is different. For instance in another version all of the processing is carried out by circuitry, and in yet another version more of the processing is carried out by the microprocessor and less by circuitry.

Certain of the elements shown in FIG. 8 are identical to those shown in the other figures, i.e. left plate 10, right plate 12, top plate 30, bottom plate 32 and reference plate 26. The display 62, 66 in FIG. 8 corresponds to the displays shown in FIG. 6. Of course there may be more than one actual LCD (liquid crystal display) used for the display, or the entire display may be in the form of a single LCD or other types of displays might be used e.g. a meter-type display or a set of illuminated lights (LEDs). Also the display may include or be limited to audible indications.

Each of the sensor plates 10, 12, 30 and 32 and the reference electrode 26 are passive, i.e. they are not excited by any external signal except by the voltage induced on them by the presence of a nearby electric voltage. Each of the sensor plates 10, 12, 30 and 32 has an associated differential amplifier 70, 72, 74 and 76. Thus each of plates 10, 12, 30 and 32 is connected to the positive input terminal of its respective differential amplifier. (Note that reference to a "differential amplifier" herein refers generally to circuitry and/or software performing the function of taking a difference between two signal amplitudes). The negative input terminal of each of these differential amplifiers 70, 72, 74, 76 is connected to the reference plate 26. Hence, each differential amplifier 70, 72, 74 and 76 provides a differential output signal which has the common mode (the signal on reference plate 26) subtracted therefrom, providing signals L, R, T and B as referred to above. Adder (summing node) 82 adds signal L and signal R, providing signal L+R. Signal L−R is provided by differential amplifier 84 connected as shown. Similarly the signals T+B and T−B are provided as shown from respectively adder (summing node) 86 and differential amplifier 88.

Hence there are four "channels" (signals) input to microprocessor 92, L+R, L−R, T+B and T−B. Each of these channels is an analog signal (a voltage amplitude) which varies over time with the alternating voltage which generates it. Each of these signals is coupled to an analog to digital converter input terminal of microprocessor 92. Hence microprocessor 92 is a conventional microprocessor or microcontroller which receives four input signals as shown at its four terminals marked ADC IN. Microprocessor 92 is e.g. a microcontroller having an 8 bit internal bus, supplied by Microchip, part number PIC 16C73. The internal circuitry of microprocessor 92 converts each received analog signal to a digital signal, by digitally sampling 65 times per each AC cycle. Hence, there are 65 samples per ¹⁄₆₀ second, for 60 cycle AC. This oversampling of the input signal is only an example. Resident in the read only memory (ROM) associated with microprocessor 92 is computer code, i.e. a computer program, which performs the functions described above to use each of the input signals to drive displays 62, 66. This computer code may be in of the various computer or assembly languages of the type well known in the art. While the actual code is not shown here, it is to be understood that one of ordinary skill in the art is able to write such code in light of this disclosure since the actual processing is relatively simple in mathematical terms, given the description herein.

In order to determine the phase L/R, T/B relationships as shown in FIG. 4, the input signals applied to each of the microprocessor 92 input terminals are counted over a particular number of samples, e.g. 65 samples. Then the computer code compares amongst each pair of signals, i.e. the first pair being L+R and L−R and the second pair being T+B and T−B, whether the two signals of each pair are in phase (left side of FIG. 4), out of phase (right side of FIG. 4), or in between (center of FIG. 4). This determination is made based on an arbitrary determination. For instance, for the L+R and L−R signal pair, if L−R is in phase with L+R more than 38 samples out of 65 samples, this is considered to be in phase. If L−R is in phase with L+R less than 16 samples out of 65, this is considered to be out of phase. If L−R is in phase with L+R for 16 to 38 samples out of 65, this is in between (over the wire). Hence while FIG. 4 only illustrates this process for the L and R signals, an identical process is carried out for the T+B and T−B pair of signals. Of course the microprocessor typically only executes one instruction at a time, so it alternates (at a very high rate with respect to the incoming signal) between processing inputs for the L and R channels and the T and B channels to determine phase.

Thus a determination is made whether the signals are in phase or out of phase or over the wire, and if they are in phase this represents the situation shown in the left portion of FIG. 4. If they are 180° out of phase, this indicates the situation in the right portion of FIG. 4; if they are in between (over the wire) this is the situation in the middle portion of FIG. 4.

Thus control of the display segments of FIG. 6B is readily understood. If the L+R and L−R signals are in phase, then the right arrow segment 60-2 is illuminated; if the L+R and L−R signals are out of phase, then the left arrow segment 60-4 is illuminated; otherwise one is over the wire in the L/R direction and only the central segment 60-5 is illuminated. A similar process involving the phase of the T−B and T+B signals illuminates one of segments 60-1, 60-3, and 60-5, to provide one of the various indications 60a etc. of FIG. 6A.

Thus this determination drives the display 62 for showing the directionality in which the detector device 50 should be moved in order to be over the target wire.

Using the same four channels of input information i.e. L+R, L−R, T+B and T−B, the microprocessor 92 determines if the signal is at or near the peak illustrated in FIG. 3, by a calculation of the type illustrated above, i.e. (L+R)/K1(L−R) and (T+B)/K2(T−B). The values K1, K2 are selected (somewhat arbitrarily) to optimize the peak, as shown below.

Figure 9:
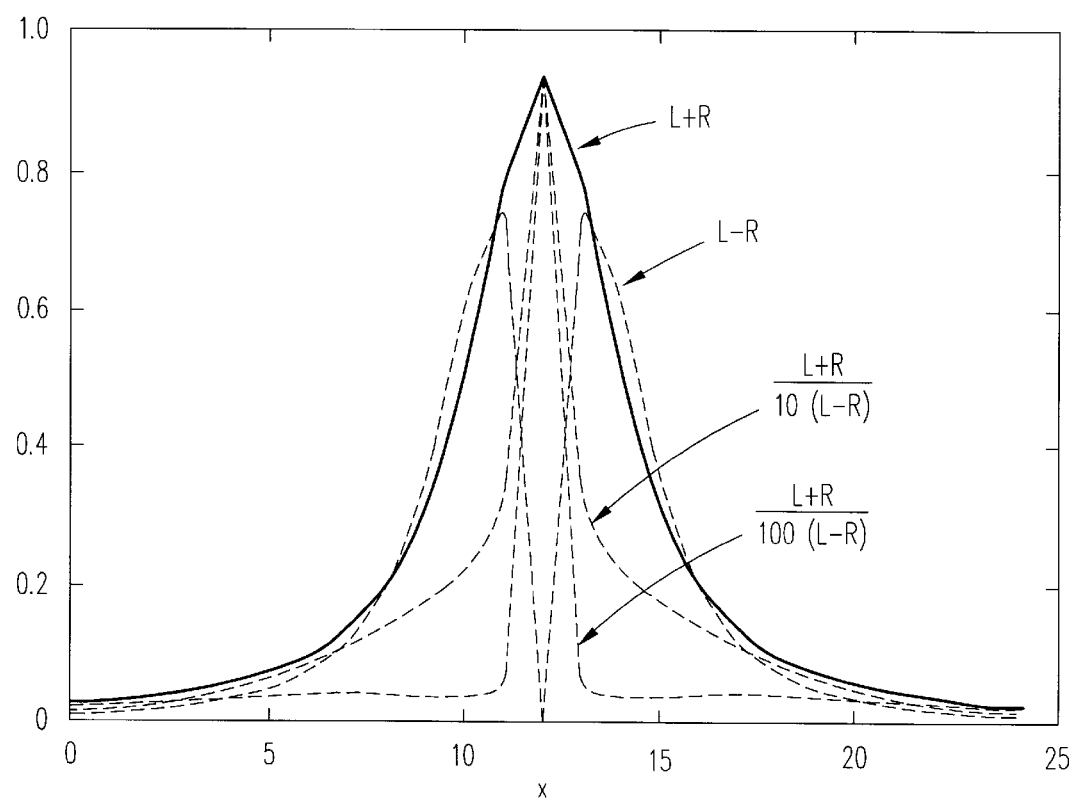
FIG. 9 shows plots of sensor signals in accordance with this invention.

FIG. 9 is a signal plot for a sensor device in accordance with this invention showing the various signal amplitudes (vertical axis) along an arbitrary scale with the horizontal axis indicating the distance to the wire which is located at the indication X. In this case plots are shown for L and R peak signals sums and differences for two scale (K) factors, i.e. 10 and 100. These plots correspond to those shown in FIGS. 1, 2 and 3.

This disclosure is illustrative and not limiting; further modifications will be apparent to one skilled in the art in the light of this disclosure and are intended to fall within the scope of the appended claims.

I claim:

1. Apparatus for sensing an alternating electric voltage in a conductor, comprising:

a reference electrode, a first sensor electrode, and a second sensor electrode, all spaced apart, the electrodes responsive to the alternating electric voltage in the conductor;

a first differential amplifier connected to receive signals from the first sensor electrode and the reference electrode, and provide a first output signal indicative of a difference between the signals from the first sensor electrode and the reference electrode;

a second differential amplifier connected to receive signals from the second sensor electrode and the reference electrode, and provide a second output signal indicative of a difference between the signals from the second sensor electrode and the reference electrode;

a third differential amplifier for receiving the output signals from the first and second differential amplifiers and providing a third output signal indicative of a difference between the output signals from the first and second differential amplifiers;

a processor coupled to receive the third output signal to process the third output signal for display; and a display driven by the processor to show presence of the alternating electric voltage in the conductor.

2. The apparatus of claim 1, wherein the first and second sensor electrodes are of the same length and width.

3. The apparatus of claim 1, further comprising:

third and fourth sensor electrodes, wherein the first, second, third and fourth sensor electrodes are arranged in a quadrilateral;

a fourth differential amplifier connected to receive signals from the third sensor electrode and the reference electrode, and provide a fourth output signal indicative of a difference between the signals from the third sensor electrode and the reference electrode;

a fifth differential amplifier connected to receive signals from the fourth sensor electrode and the reference electrode, and provide a fifth output signal indicative of a difference between the signals from the fourth sensor electrode and the reference electrode; and a sixth differential amplifier for receiving the output signals from the fourth and fifth differential amplifiers and providing a sixth output signal indicative of a difference between the output signals from the fourth and fifth differential amplifiers, wherein the sixth output signal is coupled to the processor which combines the sixth output signal with the third output signal to drive the display.

4. The apparatus of claim 3, wherein the processor includes:

means for periodically sampling the third output signal;

means for periodically sampling the sixth output signal;

means for determining a phase of the electric voltage from the sampled output signals; and means for displaying on the display an indication of a relative location of the conductor to the sensor electrodes from the determination of the phase.

5. The apparatus of claim 1, wherein the display indicates a relative proximity of the conductor to the first and second sensor electrodes.

6. The apparatus of claim 1, wherein the processor is coupled to receive a sum of the first and second output signals, and the processor determines a value from the sum, the third output signal, and a scale factor, and indicates the determined value on the display.

7. The apparatus of claim 3, wherein each of the sensor electrodes and the reference electrode are a conductive plate, all arranged co-planarly, and the four sensor electrodes are arranged in a quadrilateral, the reference electrode being arranged between at least two of the sensor electrodes.

8. The apparatus of claim 5, wherein the processor compares a phase of a sum of the first and second output signals to a phase of the third output signal, and compares a phase of a sum of the fourth and fifth output signals to the sixth output signal, and wherein the display displays the relative proximity in two dimensions.

9. A method of locating a conductor carrying an alternating electrical voltage, comprising the steps of:

holding three spaced apart sensor electrodes near the conductor, the sensor electrodes responsive to the alternating electrical voltage carried by the conductor;

determining a difference between a voltage induced in each of the first and second electrodes to that induced in the third electrode; and indicating a location of the conductor where a difference between the two voltage differences is at a minimum.

* * * * *